United States Patent [19]
Watkins

[11] 4,075,568
[45] Feb. 21, 1978

[54] ELECTRICAL CONTROL DEVICE

[75] Inventor: David Vaughan Watkins, London, England

[73] Assignee: Fidelity Radio Limited, London, England

[21] Appl. No.: 659,048

[22] Filed: Feb. 18, 1976

[30] Foreign Application Priority Data

Feb. 19, 1975  United Kingdom .................. 7094/75

[51] Int. Cl.² .......................... H03K 3/26; H04B 1/06; G01N 27/00
[52] U.S. Cl. ....................................... 328/1; 307/308; 325/464
[58] Field of Search ........................... 328/1; 307/308; 325/464; 332/5, 15

[56] References Cited

U.S. PATENT DOCUMENTS

| | | | |
|---|---|---|---|
| 3,746,886 | 7/1973 | Konopka | 332/15 |
| 3,777,290 | 12/1973 | Pitman et al. | 325/464 |
| 3,872,328 | 3/1975 | Hulsbosch et al. | 307/308 |
| 3,924,191 | 12/1975 | Collins et al. | 325/464 |

Primary Examiner—Stanley D. Miller, Jr.
Assistant Examiner—B. P. Davis
Attorney, Agent, or Firm—Weingarten, Maxham & Schurgin

[57] ABSTRACT

A continuously variable control device, e.g. a volume control in an amplifier, is so designed that after being set to a desired condition by means of the user's finger it reverts to its normal (unset) condition, means being provided to memorize or store the position to which the control was set.

14 Claims, 2 Drawing Figures

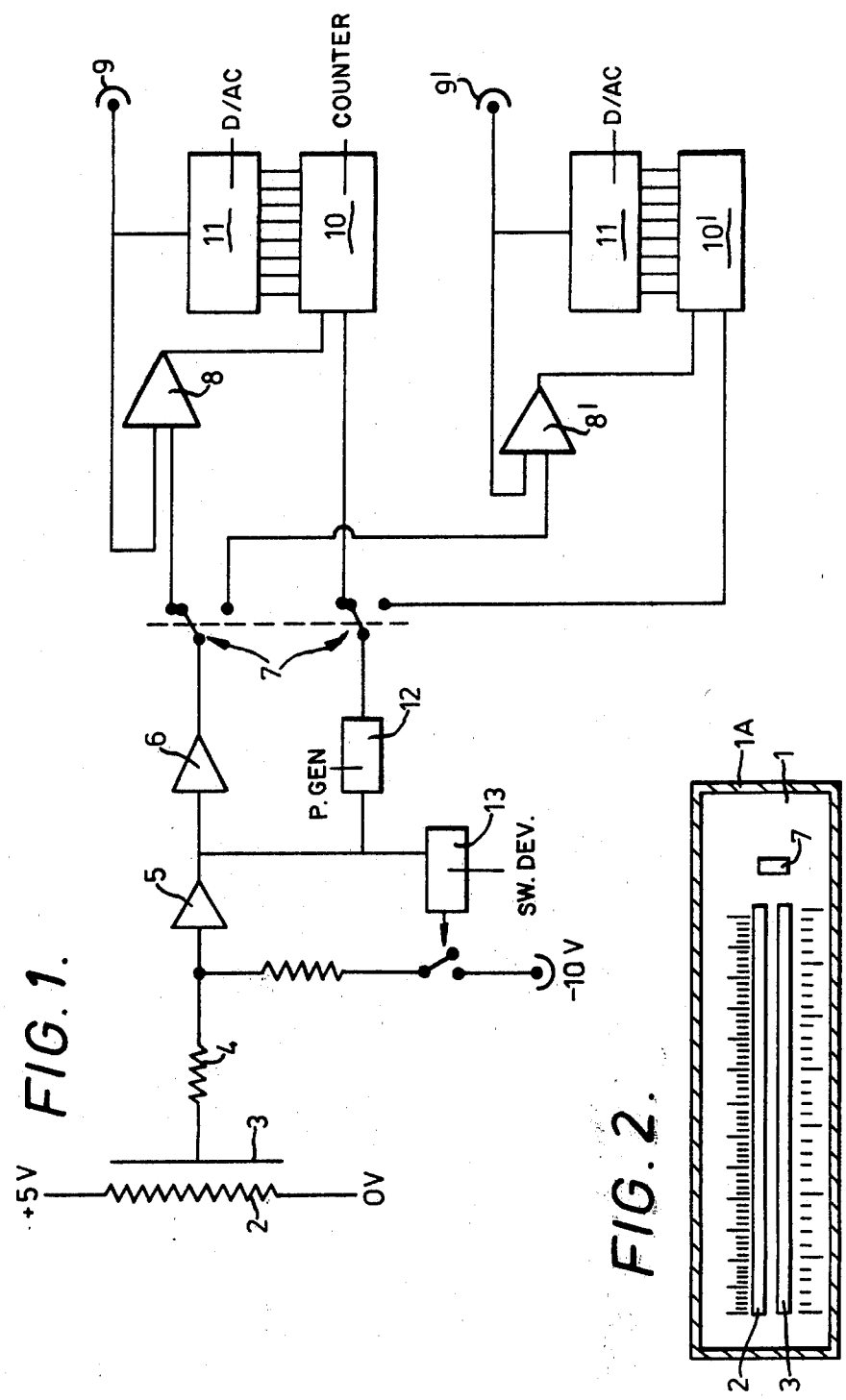

ELECTRICAL CONTROL DEVICE

BACKGROUND OF THE INVENTION

This invention relates to an electrical control device applicable for example in adjusting the volume and/or tuning of an amplifier or radio receiver or for controlling lighting or power circuits.

In the design of conventional electronic equipment considerable attention is normally given to the provision of controls which are aesthetically pleasing and easy to manipulate. Such controls often amount for a significant proportion of the cost of the equipment.

One known control system uses a linearly arranged potentiometer. The sliding contact of this is connected to a member which projects through a slot in the front panel of the apparatus and is manipulated by hand. A certain amount of effort is required in moving the contact to overcome the resistance required to hold it in the position to which it is set. Also the front panel can be quite complicated to manufacture, particularly if several potentiometer controls are to be mounted on it.

The primary object of the invention is to eliminate the necessity of making a positive effort in adjusting the controls: i.e. to make adjustment as simple as possible. Accordingly the invention provides electrical apparatus comprising a continuously variable control device which is adapted to be changed by the user from a normal condition to a chosen condition by applying his finger and which is adapted to revert to its normal condition on the removal of the finger, the said apparatus also including means to store information for electrical control purposes representing the position of the said finger in relation to the device prior to removal. Because there is no need for friction between a potentiometer contact and the potentiometer resistor in order to hold the contact in its set position, adjustment can be made much simpler.

In a preferred form of the invention the control device includes two members accessible from outside the device and arranged so that they can be bridged at different positions by the tip of one's finger, at least one of the members being a resistor member. It is convenient to make one of the two members in the form of a resistor and the other as a relatively non-resistive conductor. In this arrangement a source of potential is connected across the resistor member which is used as a potential divider, the finger acting as a bridge to tap the different potentials appearing along the resistor to the conductive member.

It is a relatively simple matter to arrange for a signal, given when the finger is removed, to be used to lock the information in the store.

Where the control device is formed by two members, one of which is a resistor, these members may be constituted by a layer of conductive ink applied to an insulating backing material e.g. by screen printing. When applied to such apparatus as a radio, amplifier, television ect. only one control device need be used for several functions e.g. volume, tuning and tone controls. Separate stores must however be provided and means for switching them in turn to the control device so that the content of each store can be separately adjusted.

BRIEF DESCRIPTION OF THE DRAWINGS

FIG. 1 is a block diagram showing the electronic circuitry of an exemplary control system constructed in accordance with the invention and;

FIG. 2 is an elevation of a radio receiver incorporating the system of FIG. 1.

DETAILED DESCRIPTION OF PREFERRED EMBODIMENT OF THE INVENTION

Referring to the drawings, the control system comprises a panel 1 of insulating material which is mounted at the front of a radio receiver 1A and carries a control device in the form of two strips 2 and 3 having parallel edges of conductive ink, which are printed alongside each other by silk screen printing. The strip 2 forms a resistor and is connected at one end to a source of potential (5 volts) and at the other end to zero potential. The strip 3 is made of a highly conductive material of negligible resistance. By placing one's finger at a particular position along the strips of the potential at that position is applied from strip 2 to strip 3, the finger thus acting as the movable contact of a potential divider. When the finger is not applied to the strips the control device 2 and 3 is referred to, for the purposes of this specification as being in its "normal condition"; when the finger is applied at the chosen position the device is referred to as being at its "chosen condition."

The strip 3 is connected to a resistor 4, which prevents the rest of the circuit being damaged by high voltage which might occur through the discharge of static from the user's body. The other end of the resistor 4 is connected to the input of an amplifier 5 having an input impedance which is high compared with that which an average finger presents between the strips 2 and 3. A suitable input impedance is 500 to 1000 megohms.

The output of the amplifier 5 is connected to a signal processing device 6 which removes any a/c signals which might be present. The output of the signal processing device is connected through a switch 7 to one input of a comparator 8. The other input of this comparator 8 is derived from an output 9. The comparator feeds an up/down signal to a digital counter 10 so that the count is made to increase when the potential at the output of 6 is greater than at 9 and vice versa. The potential at 9 is determined by a digital to analogue converter 11. Thus the output at 9 follows the potential at the output of 6.

Clock pulses for the counter 10 are generated by a pulse generator 12.

When the potential of the strip 3 reaches a very low value, indicative of the fact that the user has removed his finger, the output of the amplifier 6 drops to a value at which it operates a switching device 13. This connects the input of the amplifier 5 to the −10 volt potential shown in FIG. 1. The output of the amplifier 5 thus drops even further, thereby firmly establishing the closed position of the switch 13 and also de-activating the generator 12. This means that spurious changes in potential at strip 3 when the finger is not present do not affect the content of the counter because their amplitude will not reach a sufficiently high value to activate the pulse generator. The components 10 and 11 behave as a store of information representing the position of the user's finger along the strips 2 and 3 when the finger is removed.

The output at 9 is used to control the volume of the receiver. The same control device can however also be used to control the tuning. This is done by moving the switch 7 to its other position. The components 8', 9', 10' and 11' then operate in a similar fashion to their counterparts and the potential at 9' is used to control the tuning.

It is obvious that, in a similar way, other functions such as tone, could be controlled.

It is emphasised that the illustrated embodiment has been described only as one example of many different ways in which the invention can be applied. In one modification of this, both of the strips 2 and 3 could be resistive. Also, the strips 2 and 3 can have alternate configurations. They could for example be arranged in a spiral and they can be printed on curved surfaces. In order to give non-linear characteristics one or both strips could vary in width or, by printing several layers of conductive ink over one another, could vary in thickness. In yet another modification the system of strips 2 and 3 could be adapted to be supplied by an alternating voltage.

In a further modification four parallel strips are used, two being resistive and connected across sources of potential of different values. In this construction the two other strips are connected to a differential amplifier so that any common a/c components of the sources of potential are disregarded.

Yet another modification is to use some form of capacitative element instead of the resistive strip 2. In this case it may not absolutely be necessary to touch the control device with one's finger: it is sufficient to place the finger close to the device.

I claim:

1. Electrical apparatus comprising:
   a control device defining a continuously variable quantity which can be set to a selected value by application of the operator's finger;
   sensing means connected to said control device and having a first output signal variable over a range of values when the finger is present at said control device thereby placing said control device in a chosen condition, and having a second output signal when in the normal condition with the finger absent from said control device; and
   digital storage means coupled to said control device and said sensing means, said storage means being adapted to positively store information representative of said selected value upon removal of the finger from said control device.

2. Apparatus in accordance with claim 1 wherein the said control device is adapted to be changed from the said normal condition to the said chosen condition by sliding the finger along the said control device.

3. Apparatus in accordance with claim 1 wherein the said device is adapted to sense the proximity of the user's finger.

4. Apparatus in accordance with claim 1 wherein the control device includes two members accessible from outside the said device and arranged so that they can be bridged at different positions by the tip of one's finger, at least one of said members being a resistor member.

5. Apparatus in accordance with claim 1 including means to give a signal on releasing the finger, and means to lock the said information in said storage means in response to said signal.

6. Apparatus in accordance with claim 4 wherein said resistor member is adapted to have a potential difference connected across it and in which the other member is a conductor or resistor member of different value to which the potential at different positions along the resistor can be tapped using the tip of the finger as a bridge.

7. Apparatus in accordance with claim 6 wherein said conductor is connected to the input of an amplifier having an input impedance which is high compared with the impedance presented between the conductor member and the resistor member, said amplifier being included in said sensing means.

8. Apparatus in accordance with claim 7 wherein the said digital storage means comprises a counter whose output is connected to a digital to analogue converter, said counter being driven by a pulse generator and being associated with a comparator connected to make the counter count up when the output of the amplifier is higher than the ouput of said converter, and down when the output of the amplifier is lower than the output of said converter.

9. Apparatus in accordance with claim 8 including means to prevent said counter from counting up or down when the output of said amplifier indicates that the finger is removed.

10. Apparatus in accordance with claim 1 including more than one storage means and means for connecting the stores selectively to the control device, each store controlling a different characteristic of the apparatus.

11. Electrical apparatus comprising:
    input control means having a first output signal continuously variable over a predetermined range of values in response to positioning of the operator's finger thereon to provide selective electrical continuity and place said input control means in a chosen condition, and having a second output signal in the normal condition in the absence of the finger;
    sensing means connected to and responsive to the output of said input control means to provide a third output signal variable over a predetermined range of values in response to said first output signal from said input control means, and a fourth output signal in response to said second output signal from said input control means; and
    digital storage means coupled to said sensing means, said digital storage means positively storing information proportional to the value of said third output signal from said sensing means and the last position of the finger upon removal of the finger from said input control means.

12. Apparatus in accordance with claim 11 wherein said input control means comprises an elongated resistor and an elongated conductor spaced therefrom, said resistor and said conductor being adapted to be bridged by the operator's finger.

13. Apparatus in accordance with claim 11 wherein said sensing means comprises:
    an amplifier having its input connected to the output of said input control means;
    a comparator having one input coupled to the output of said amplifier and the other input connected to the output of said digital control means;
    a terminal having a potential substantially different than the value of said first output signal when said input control means is in said chosen position; and
    means for connecting said amplifier input to said second terminal in response to removal of the finger from said input control means;
    information representing the position of the finger when the finger is removed from the input control means being locked into said digital storage means in response to the output of said amplifier when connected to said second terminal.

14. Apparatus in accordance with claim 13 and further comprising a pulse generator connected between said amplifier and said digital storage means, said pulse generator being disabled when said amplifier is connected to said second terminal.

* * * * *

UNITED STATES PATENT AND TRADEMARK OFFICE
CERTIFICATE OF CORRECTION

PATENT NO. : 4,075,568
DATED : February 21, 1978
INVENTOR(S) : David Vaughan Watkins It is certified that error appears in the above-identified patent and that said Letters Patent are hereby corrected as shown below:

Cclumn 1, line 12, "amount" should read --account--; and
          line 59, "ect." should read --etc.--.
Column 3, line 7, "alternate" should read --alternative--.
Column 4, line 18, "stores" should read --storage means--.

Signed and Sealed this

Twenty-seventh Day of June 1978

[SEAL]

Attest:

RUTH C. MASON
Attesting Officer

DONALD W. BANNER
Commissioner of Patents and Trademarks